(12) United States Patent
Lee et al.

(10) Patent No.: US 6,697,403 B2
(45) Date of Patent: Feb. 24, 2004

(54) LIGHT-EMITTING DEVICE AND LIGHT-EMITTING APPARATUS USING THE SAME

(75) Inventors: Eun-kyung Lee, Gyeonggi-do (KR); Byoung-lyong Choi, Seoul (KR); Jae-ho You, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/122,416

(22) Filed: Apr. 16, 2002

(65) Prior Publication Data

US 2002/0153845 A1 Oct. 24, 2002

(30) Foreign Application Priority Data

Apr. 17, 2001 (KR) .......................................... 2001-20494
Mar. 23, 2002 (KR) .......................................... 2002-15902

(51) Int. Cl.[7] .......................... H01S 5/00; H01L 29/227
(52) U.S. Cl. ........................................... 372/43; 257/98
(58) Field of Search .............................. 372/92, 96, 99; 257/84, 80, 13–14, 43–50

(56) References Cited

U.S. PATENT DOCUMENTS

| | | | |
|---|---|---|---|
| 5,274,248 A | * | 12/1993 | Yokogawa et al. ............ 257/22 |
| 5,295,147 A | * | 3/1994 | Jewell et al. .................. 372/45 |
| 5,600,157 A | * | 2/1997 | Abiko et al. .................... 257/84 |
| 5,909,280 A | * | 6/1999 | Zavracky ...................... 356/454 |
| 6,246,708 B1 | * | 6/2001 | Thornton et al. ............. 372/50 |
| 6,288,415 B1 | * | 9/2001 | Leong et al. .................. 257/94 |
| 6,362,069 B1 | * | 3/2002 | Forrest et al. ............... 438/401 |
| 6,376,865 B1 | * | 4/2002 | Oh et al. ..................... 257/103 |
| 6,380,012 B1 | * | 4/2002 | Chen ........................... 438/174 |
| 6,381,022 B1 | * | 4/2002 | Zavracky ..................... 356/454 |
| 6,384,462 B1 | * | 5/2002 | Pauchard et al. ........... 257/461 |
| 6,403,983 B1 | * | 6/2002 | Mizuno ........................ 257/79 |
| 6,531,367 B2 | * | 3/2003 | Chen ........................... 438/305 |
| 6,583,482 B2 | * | 6/2003 | Pauchard et al. ........... 257/438 |
| 2002/0149015 A1 | * | 10/2002 | Choi et al. .................... 357/59 |

* cited by examiner

Primary Examiner—Paul Ip
Assistant Examiner—Phillip Nguyen
(74) Attorney, Agent, or Firm—Staas & Halsey LLP

(57) ABSTRACT

A light-emitting device and a light-emitting apparatus using the same. The light-emitting device includes an n-type or p-type substrate, a doped region formed on a first surface of the substrate with a predetermined dopant to be an opposite type from that of the substrate, to an ultra-shallow depth such that light is emitted from a p-n junction between the doped region and the substrate by a quantum confinement effect, a resonator which improves the selectivity of wavelength of the light emitted from the p-n junction, and first and second electrodes formed on the first surface and a second surface of the substrate, respectively, for injection of holes and electrons. The light-emitting device includes the ultra-shallow doped region so that it can emit light with a quantum confinement effect in the p-n junction. A resonator structure to resonate only a particular wavelength range of light is added to the light-emitting device so that the selectivity of light wavelength is markedly improved with excellent efficiency. The intensity of light emission is amplified by the resonator structure, and the directional property of the emitted light can be improved further than that of conventional light-emitting devices.

22 Claims, 3 Drawing Sheets

Longitudinal QW

Laternal QW

LIGHT-EMITTING DEVICE AND LIGHT-EMITTING APPARATUS USING THE SAME

CROSS-REFERENCE TO RELATED APPLICATIONS

This application claims the benefit of Korean Application No. 01-20494, filed Apr. 17, 2001, and 02-15902, filed on Mar. 23, 2002 in the Korean Industrial Property Office, the disclosures of which are incorporated herein by reference.

BACKGROUND OF THE INVENTION

1. Field of the Invention

The present invention relates to a high-efficiency light-emitting device and a light-emitting apparatus using the same.

2. Description of the Related Art

Silicon semiconductor substrates can be used to highly integrate logic devices, operator devices, and drive devices therein with high reliability. Because silicon is cheap, highly integrated circuits can be formed on a silicon substrate at lower cost, compared to using a compound semiconductor. For this reason, silicon has been used as a base material for most integrated circuits.

Based on the advantage of silicon, steady efforts have been made to manufacture a silicon-based light-emitting device so as to implement a low-cost optoelectronic device that can be manufactured by the general process used to form integrated circuits. It has been experimentally confirmed that porous silicon and nano-crystal silicon have the ability to emit light. Accordingly, research on this idea continues to be conducted.

FIG. 1 illustrates a cross-section of a porous silicon region formed in the surface of a bulk monocrystalline silicon and the energy bandgap between the valence band and conduction band in the porous silicon region.

Porous silicon can be attained by anodic electrochemical dissolution on the surface of bulk monocrystalline silicon (Si) in an electrolyte solution containing, for example, a hydrofluoric (HF) acid solution.

While a bulk silicon is subjected to anodic electrochemical dissolution in a HF solution, a porous silicon region 1 having a number of pores 1a is formed in the surface of the bulk silicon, as illustrated in FIG. 1. In the region where the pores 1a are formed, more Si—H bonds exist than in a projection region 1b, which is not dissolved by hydrofluoric acid. The energy bandgap between the valence band (Ev) and the conduction band (Ec) appears to be inversed with respect to the shape of the porous silicon region 1.

A recession region in the energy bandgap curve, which is surrounded by projection regions and corresponds to the projection region 1b surrounded by the pore region 1a in the porous silicon region 1, provides a quantum confinement effect so that the energy bandgap in this region is increased over that of the bulk silicon. Also, in this region, holes and electrons are trapped, emitting light.

For example, in the porous silicon region 1, the projection region 1b surrounded by the pore region 1a is formed as a quantum wire of monocrystalline silicon to provide the quantum confinement effect, and electrons and holes are trapped by the quantum wire and coupled to emit light. The wavelengths of emitted light can range from a near infrared wavelength to a blue wavelength according to the dimension (width and length) of the quantum wire. Here, the period of the pore region 1a is, for example, about 5 nm, and the porous silicon region 1 has a maximum thickness of, for example, 3 nm, as illustrated in FIG. 1.

Therefore, after manufacturing a porous silicon-based light-emitting device, as a predetermined voltage is applied to the light-emitting device where the porous silicon region 1 is formed, a desired wavelength of light can be emitted depending on the porosity of the porous silicon region 1.

However, such a porous silicon-based light-emitting device as described above is not highly reliable yet as a light-emitting device and has an external quantum efficiency (EQE) as low as 0.1%.

FIG. 2 is a sectional view of an example of a nano-crystal silicon-based light-emitting device. Referring to FIG. 2, the nano-crystal silicon-based light-emitting device has a layered structure including a p-type monocrystalline silicon substrate 2, an amorphous silicon layer 3 formed on the silicon substrate 2, an insulating layer 5 formed on the amorphous silicon layer 3, and lower and upper electrodes 6 and 7 formed on the bottom of the silicon substrate 2 and the top of the insulating layer 5, respectively. A nano-crystal silicon 4 is formed as a quantum dot in the amorphous silicon layer 3.

The nano-crystal silicon 4 is formed in a quantum dot form as the amorphous silicon layer 3 is rapidly heated to 700° C. in an oxygen atmosphere for recrystallization. Here, the amorphous silicon layer 3 has a thickness of 3 nm, and the nano-crystal silicon 4 has a size of about 2–3 nm.

In the light-emitting device using the nano-crystal silicon 4 described above, as a reverse bias voltage is applied across the upper and lower electrodes 7 and 6, an intensive electric field is generated at the ends of the amorphous silicon layer 3 between the silicon substrate 2 and the nano-crystal silicon 4 so that electrons and holes excited to a high-energy level are generated. The electrons and holes are tunneled into the nano-crystal silicon 4 and couple to each other therein to emit light. In the nano-crystal silicon-based light-emitting device, the wavelength of light generated therefrom becomes shorter as the size of the nano-crystal silicon quantum dot decreases.

In the light-emitting device using the nano-crystal silicon 4 described above, it is difficult to control the size and uniformity of the nano-crystal silicon quantum dot, and efficiency is very low.

SUMMARY OF THE INVENTION

Accordingly, it is an object of the present invention to provide a light-emitting device and light-emitting apparatus using the same, the light-emitting device having a higher efficiency than light-emitting devices formed using porous silicon and nano-crystal silicon and an improved selectivity of wavelength of emitted light.

Additional objects and advantages of the invention will be set forth in part in the description which follows and, in part, will be obvious from the description, or may be learned by practice of the invention.

The foregoing and other objects of the present invention are achieved by providing a light-emitting device comprising: an n-type or p-type substrate; a doped region formed on a first surface of the substrate with a predetermined dopant to be an opposite type from that of the substrate, to an ultra-shallow depth such that light is emitted from a p-n junction between the doped region and the substrate by a quantum confinement effect; a resonator which improves the selectivity of wavelength of the light emitted from the p-n junction; and first and second electrodes formed on the first surface and a second surface of the substrate, respectively, to inject holes and electrons.

In an embodiment of the present invention the resonator comprises: a first reflective layer formed on the second surface of the substrate; and a second reflective layer formed on the doped region and together with the first reflective layer improves the selectivity of the wavelength of light being emitted, wherein one of the first and second reflective layers is formed with a lower reflectivity than the other so that the light externally emits through the first or second reflective layer having the lower reflectivity. Preferably, the second reflective layer is a distributed Bragg reflector (DBR) formed by alternating material layers having different refractive indices. The first reflective layer may be formed on the second surface of the substrate, and the first electrode may be formed on the second surface of the substrate surrounding the first reflective layer. Alternatively, the first electrode can be formed of a transparent electrode between the second surface of the substrate and the first reflective layer.

In an aspect of the present invention, the light-emitting device further comprises a control layer on one surface of the substrate to act as a mask in forming the doped region and to limit the depth of the doped region to be ultra-shallow.

In an aspect of the present invention, the substrate is formed of a predetermined semiconductor material including silicon, and the control layer is formed of a silicon oxide layer of an appropriate thickness such that the doped region can be formed to the ultra-shallow depth.

The foregoing and other objects of the present invention may also be achieved by providing a light-emitting apparatus including at least one light-emitting device and being applicable to an illumination system or a display system, the at least one light-emitting device comprising: an n-type or p-type substrate; a doped region formed on a first surface of the substrate with a predetermined dopant to be an opposite type from that of the substrate, to an ultra-shallow depth such that light is emitted from a p-n junction between the doped region and the substrate by a quantum confinement effect; a resonator which improves the selectivity of the wavelength of the light emitted from the p-n junction; and first and second electrodes formed on the first surface and a second surface of the substrate, respectively, to inject holes and electrons.

BRIEF DESCRIPTION OF THE DRAWINGS

The above object and advantages of the present invention will become more apparent by describing in detail preferred embodiments thereof with reference to the attached drawings in which.

These and other objects and advantages of the invention will become apparent and more readily appreciated from the following description of the embodiments, taken in conjunction with the accompanying drawings of which.

DETAILED DESCRIPTION OF THE INVENTION

Figure 1:
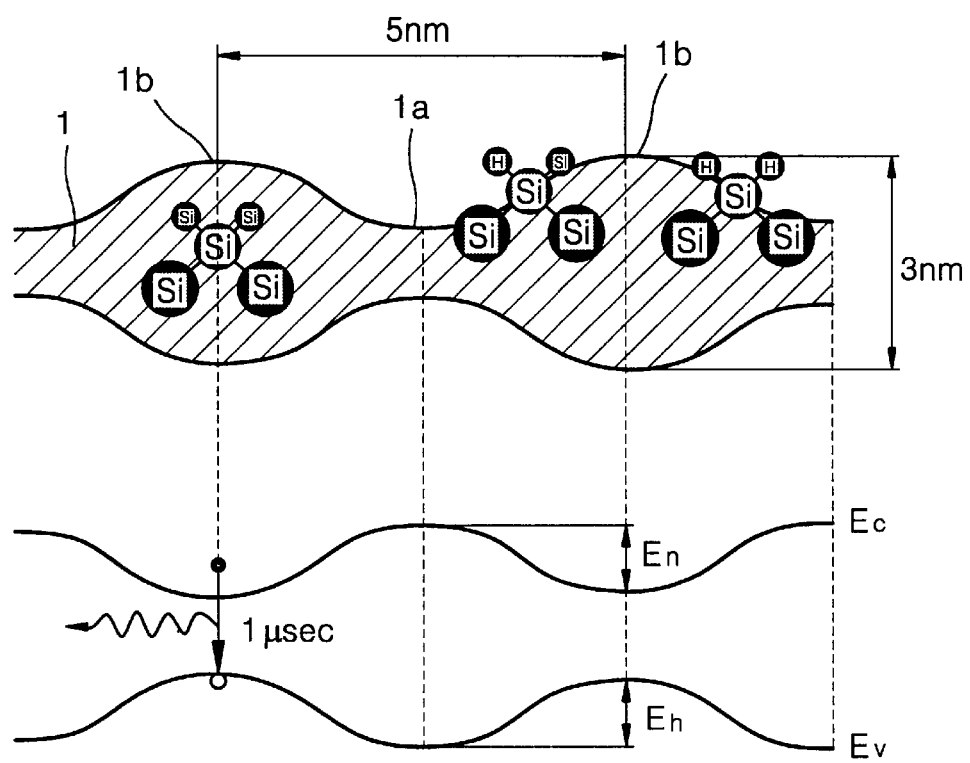
FIG. 1 illustrates a cross-section of a porous silicon region formed in the surface of a bulk monocrystalline silicon and the energy bandgap between the valence band and conduction band in the porous silicon region.
Figure 2:
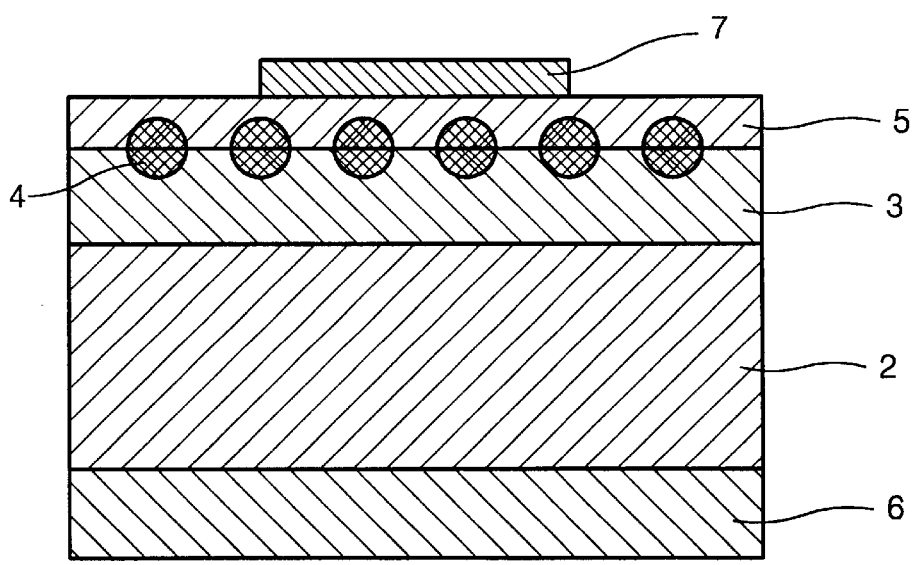
FIG. 2 is a sectional view of an example of a nano-crystal silicon-based light-emitting device.

Reference will now be made in detail to the embodiments of the present invention, examples of which are illustrated in the accompanying drawings, wherein like reference numerals refer to like elements throughout. The embodiments are described below in order to explain the present invention by referring to the figures.

Figure 3:
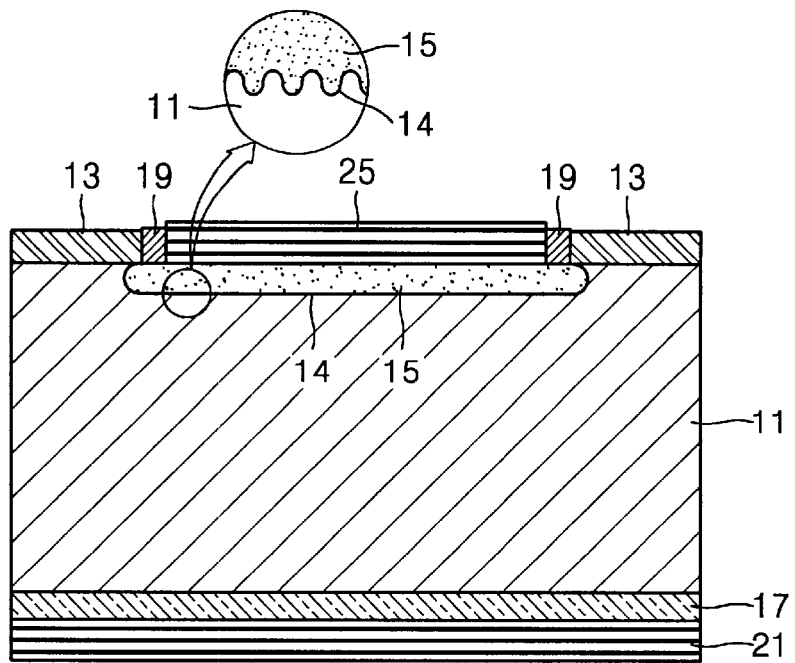
FIG. 3 is a sectional view of an embodiment of a light-emitting device according to the present invention.
Figure 4:
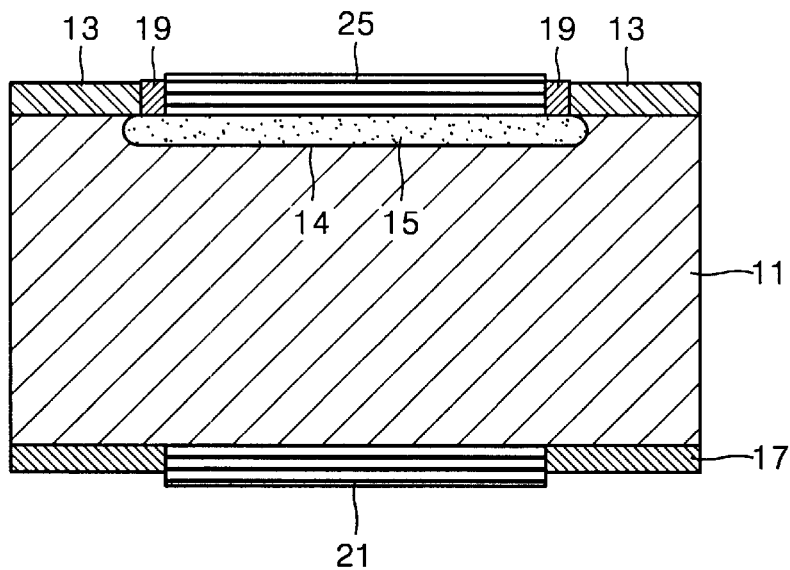
FIG. 4 is a sectional view of another embodiment of the light-emitting device according to the present invention.

FIGS. 3 and 4 are sectional views of separate embodiments, respectively, of a light-emitting device according to the present invention.

Referring to FIGS. 3 and 4, each of the embodiments of the light-emitting device includes a substrate 11, a doped region 15 formed in a first surface of the substrate 11, a resonator to improve the selectivity of the wavelength of emitted light, and first and second electrodes 17 and 19 formed on a second surface and the first surface, respectively, of the substrate 11 to inject holes and electrons. The light-emitting devices according to the embodiments of the present invention further include a control layer 13 on the first surface of the substrate 11, which acts as a mask in forming the doped region 15 and enables formation of the doped region 15 to a desired ultra-shallow depth. The control layer 13 is necessary to form the doped region 15 of the light-emitting device according to the embodiments of the present invention and can be selectively removed after the formation of the doped region 15.

The substrate 11 is formed of a predetermined semiconductor material including silicon, for example, silicon, silicon carbide, or diamond. In an embodiment of the present invention, the substrate 11 is doped with an n-type dopant.

The doped region 15 is formed by non-equilibrium diffusion of a predetermined dopant, for example, boron or phosphorous, into the substrate 11 through an aperture in the control layer 13. The doped region 15 is doped with an opposite type of dopant to the substrate 11, for example, a $p^+$-type dopant.

In doping the doped region 15, it is preferable that the doped region 15 is doped to an ultra-shallow depth such that at least one of a quantum well, quantum dot, and quantum wire is formed between the doped region 15 and the substrate 11, i.e., in a p-n junction 14, to provide a quantum confinement effect enabling photoelectrical conversion.

A quantum well is mostly formed in the p-n junction 14, but a quantum dot or quantum wire can be formed in the p-n junction 14. At least two of the quantum well, quantum dot, and quantum wire may be formed together in the p-n junction 14. Hereinafter, the present invention will be described such that a quantum well is formed in the p-n junction 14 for the purpose of simplicity. Although the present invention is described below such that a quantum well is formed in the p-n junction 14, it will be appreciated that the quantum well may be regarded as at least one of quantum well, quantum dot and quantum wire.

Figure 5A:
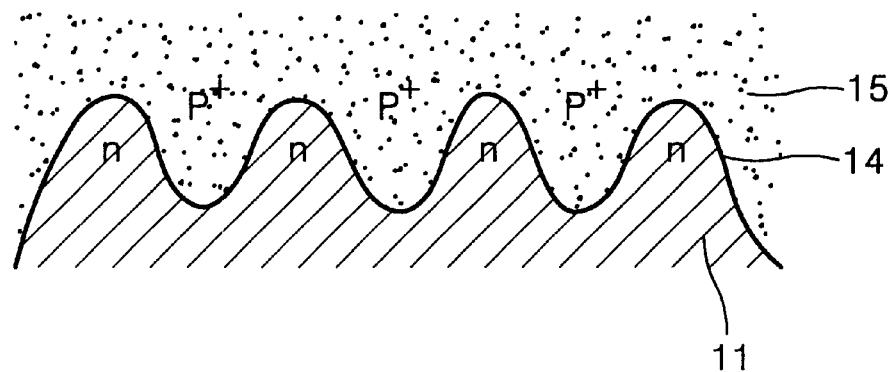
FIG. 5A illustrates the structure of a p-n junction as a doped region 15 is formed to an ultra-shallow depth by non-equilibrium diffusion.
Figure 5B:
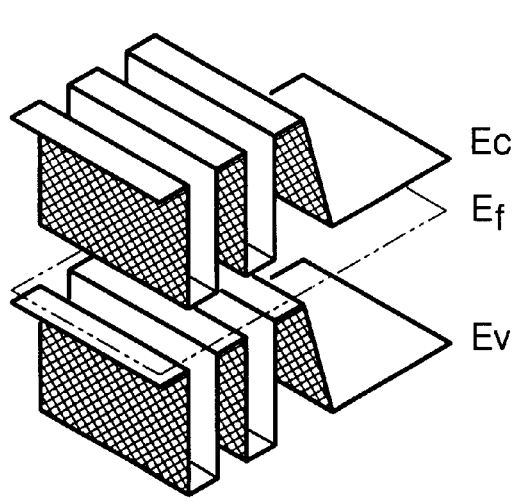
FIG. 5B illustrates the energy bands of longitudinal and lateral quantum wells formed in the p-n junction of FIG. 5A by non-equilibrium diffusion.
Figure 5B:
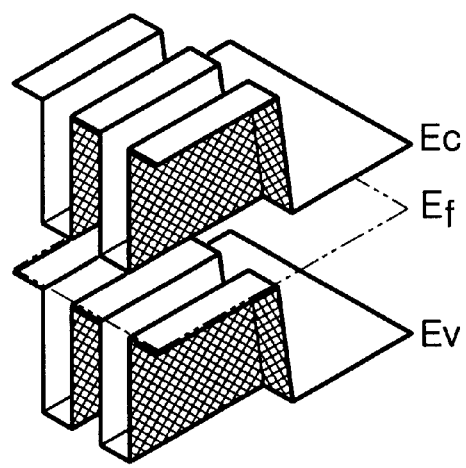

FIG. 5A illustrates the structure of the p-n junction 14 as the doped region 15 formed to an ultra-shallow depth by non-equilibrium diffusion. FIG. 5B illustrates the energy bands of longitudinal and lateral quantum wells (QW) formed in the p-n junction 14 of FIG. 5A by non-equilibrium diffusion. In FIG. 5B, Ec denotes the conduction band energy level, Ev denotes the valence band energy level, and Ef denotes the Fermi energy level. These energy levels are well known in the semiconductor related field, and thus descriptions thereof will be omitted here.

As illustrated in FIGS. 5A and 5B, near the p-n junction 14, doped regions of different dopant types are alternately formed to provide a quantum well structure. The quantum well and the underlying barrier have a depth of, for example, 2 nm and 3 nm, respectively.

Doping the p-n junction 14 to form the quantum well to such an ultra-shallow depth can be implemented by controlling the thickness of the control layer 13 and the diffusion process conditions to be optimal.

By an appropriate diffusion temperature and the deformed potential on the surface of the substrate 11, the thickness of the diffusion profile can be adjusted to, for example, 10–20 nm, during the diffusion process. As a result, the quantum well system in such an ultra-shallow diffusion profile is formed. The surface of the substrate 11 is deformed by the thickness of the initial control layer and pre-surface treatment, and the deformation becomes serious while processing.

When the substrate 11 is formed of a predetermined semiconductor material including silicon, it is preferable that the control layer 13 is formed of a silicon oxide ($SiO_2$) layer of an appropriate thickness such that the doped region 15 can be doped to an ultra-shallow depth. As an example, to form the control layer 13, a silicon oxide layer is formed on the first surface of the substrate 11, and the silicon oxide layer is etched by photolithography to remove an aperture portion for diffusion, thereby resulting in the control layer 13 having a mask structure.

As is known in the field of diffusion technology, if the thickness of the silicon oxide layer is over an appropriate thickness (thousands of angstroms) or if the diffusion temperature is low, the diffusion is affected by vacancy and results in a deep diffusion profile. In contrast, if the thickness of the silicon oxide layer is less than the appropriate thickness, or if the diffusion temperature is high, the diffusion is affected by self-interstitial of silicon and results in a deep diffusion profile. Therefore, by forming the silicon oxide layer to the appropriate thickness at which self-interstitial of silicon and vacancy are generated in a similar ratio and coupled to each other so that diffusion of dopants cannot be facilitated, ultra-shallow doping can be achieved. Physical properties related with vacancy and self-interstitial are well known in the field of diffusion technology, and thus detailed descriptions thereof will be omitted.

Alternatively, the substrate 11 may be doped with a p-type dopant, and the doped region 15 may be doped with an $n^+$-type dopant.

The resonator includes a first reflective layer 21 formed on the second surface of the substrate 11 and a second reflective layer 25 formed on the doped region 15, to improve the selectivity of the wavelength of emitted light.

To maximize efficiency of light generated and externally emitted in a desired direction, the first reflective layer 21 is formed to have a high reflectivity of, preferably nearly 100%. In an embodiment of the present invention, the second reflective layer 25 close to the doped region 15 is formed to have a lower reflectivity than the first reflective layer 21 such that light generated from the p-n junction 14 is externally emitted through the second reflective layer 25. In an alternative structure of the resonator, the first reflective layer 21 can be formed to have a lower reflectivity than the second reflective layer 25 such that the generated light can be externally emitted through the first reflective layer 21.

The first reflective layer 21 may be implemented with a general reflective layer or distributed Bragg reflector (DBR). Preferably, the second reflective layer 25 is formed with a DBR to reduce the bandwidth of emission spectrum. The second reflective layer 25 is formed in the aperture portion of the control layer 13, except for a region of the second electrode 19. Here, the DBR is formed by alternating material layers, for example, compound semiconductor material layers, having different reflective indices, as required. When a resonator having the first and second reflective layers 21 and 25 both as DBRs and which externally emits the generated light through the second reflective layer 25 is desired, the second reflective layer 25 is formed by stacking less material layers than for the first reflective layer 21 so that the second reflective layer 25 has a lower reflectivity than the first reflective layer 21, as described above.

When the resonator having such a structure described above is used, only light of a particular wavelength region according to the resonance condition of the resonator can be amplified and emitted, so that the selectivity of the wavelengths of the emitted light are markedly improved. The resonator is provided with the resonance condition for a desired wavelength region of light to be emitted.

The first electrode 17 is formed on the second surface of the substrate 11, and the second electrode 19 is formed on the first surface of the substrate 11 surrounding the second reflective layer 25.

As illustrated in the FIG. 3 embodiment, the first electrode 17 may be interposed between the second surface of the substrate 11 and the first reflective layer 21. In this case, the first electrode 17 is formed as a transparent electrode using, for example, indium tin oxide (ITO) so that light transmits through the first electrode 17.

As illustrated in the FIG. 4 embodiment, the first reflective layer 21 may be formed only in a region on the second surface of the substrate 11 with the most intensive reflection effect, and the first electrode 17 is formed on the second surface of the substrate 11 surrounding the first reflective layer 21.

Light-emitting devices according to the present invention having the structure described above can emit light because they have the quantum well, where electron-hole pairs recombine (annihilate), in the p-n junction 14 between the doped region 15 and the substrate 11, as described above. After the light emission, only light of a desired wavelength region according to the resonance condition of the resonator including the first and second reflective layers 21 and 25 is amplified and externally emitted through the second reflective layer 25. It is appreciated that the intensity and wavelength of emitted light are dependent upon the quantity of current applied.

The light-emitting devices according to the present invention emit light as follows. For example, as a power (voltage or current) is applied across the first electrode 17 and the second electrode 19, carriers such as electrons and holes are injected into the quantum well in the p-n junction 14 and recombine (annihilate) due to the sub-band energy level in the quantum well. Here, electroluminescence EL of a predetermined wavelength occurs according to the state where the carriers combine. The intensity of emitted light changes according to variations in the quantity of power (voltage or current) applied across the first and second electrodes 17 and 19.

The wavelength of light emitted from a light-emitting device according to the embodiments of the present invention is primarily determined by the micro-cavities resulting from micro-defects in the surface of the substrate 11

(actually, the surface of the doped region 15). By adjusting the size of the micro-cavities in the manufacture of the light-emitting devices, light-emitting devices emitting light of a desired wavelength range can be attained.

The intensity of electroluminescence may be amplified if the wavelength of electroluminescence matches the resonance frequency of the micro-cavities resulting from micro-defects in the surface of the substrate 11.

The micro-cavities occur due to the deformed potential resulting from micro-defects on the doped region 15. The quantum well may be deformed under the control of the deformed potential, so that the size of the micro-cavities is determined. By adjusting the size of the micro-cavities in this manner, light of a desired wavelength range can be emitted.

As described above, the light-emitting devices according to the embodiments of the present invention provide a quantum confinement effect as a result of a localized change in charge distribution potential in the p-n junction 14 underneath the doped region 15. Also, due to the sub-band energy level in the quantum well, the light-emitting devices according to the embodiments of the present invention have a high quantum efficiency.

The light-emitting devices according to the embodiments of the present invention amplify only light of a desired narrow wavelength band, among wavelength bands of light emitted from the p-n junction 14, according to the resonance condition of the resonator including the first and second reflective layers 21 and 25.

The light-emitting devices according to the embodiment of the present invention described above can be applied to a light-emitting apparatus used as a display system or illumination system with improved sharpness of color, compared to when conventional light-emitting devices are applied. The light-emitting apparatus includes at least one light-emitting device according to the present invention.

When the light-emitting apparatus employing the light-emitting devices according to the present invention is for a display system, the light-emitting apparatus is constructed with a plurality of light-emitting devices according to the present invention arranged in two dimensions. The light-emitting devices according to the embodiments of the present invention can be manufactured to be much smaller in size using a semiconductor material through the process applied to manufacture a semiconductor device. Thus, it is obvious that the light-emitting devices according to the present invention can be applied to a display system, especially a flat panel solid state display. The light-emitting devices according to the present invention have highly enhanced wavelength selectivity. Therefore, if each of the light-emitting devices used as a light-emitting apparatus according to the present invention are constructed with the resonance condition for respective color pixels of a desired display system and then assembled to construct the display system, the colors of R, G, B can be implemented without a separate color filter. It is appreciated that an additional color filter could be installed in the light-emitting apparatus according to the present invention to improve the sharpness of display color.

When the light-emitting apparatus employing the light-emitting devices according to the present invention is for an illumination system, the light-emitting apparatus is constructed with at least one light-emitting device according to an embodiment of the present invention to comply with the use of the illumination system and the illuminance requirement thereto. The light-emitting devices used as the light-emitting apparatus includes a resonator optimized for the color requirement.

The above-description of the light-emitting apparatus employing the light-emitting devices according to the present invention is enough to infer the entire structure of the light-emitting apparatus, and thus an illustration thereof will be omitted.

As described above, in the light-emitting devices and the light-emitting apparatus employing the light-emitting devices according to the present invention, an ultra-shallow doped region is formed so that light can be emitted with the quantum confinement effect in the p-n junction. A resonator structure for resonating only a particular wavelength range of light is added so that the selectivity of light wavelength is markedly improved with excellent efficiency. The intensity of light emission is amplified by the resonator structure, and the directional property of the emitted light can be improved further than that of conventional light-emitting devices.

Although a few preferred embodiments of the present invention have been shown and described, it will be appreciated by those skilled in the art that changes may be made in these embodiments without departing from the principles and spirit of the invention, the scope of which is defined in the claims and the equivalents.

What is claimed is:

1. A light-emitting device, comprising:
   an n-type or p-type substrate;
   a doped region formed on a first surface of said substrate with a predetermined dopant to be an opposite type from that of said substrate, and to have an ultra-shallow depth so that light is emitted from a p-n junction between said doped region and said substrate by a quantum confinement effect;
   a resonator which improves the selectivity of wavelength of the light emitted from the p-n junction; and
   first and second electrodes formed on the first surface and a second surface of said substrate, respectively, to inject holes and electrons,
   wherein the resonator includes:
      a first reflective layer formed on the second surface of said substrate; and
      a second reflective layer formed on said doped region and together with said first reflective layer improves the selectivity of the wavelength of light being emitted,
      one of said first and second reflective layers being formed with a lower reflectivity than the other so that the light externally emits through the first or second reflective layer having the lower reflectivity.

2. The light-emitting device according to claim 1, wherein said second reflective layer is a distributed Bragg reflector (DBR) formed by alternating material layers having different refractive indices.

3. The light-emitting device according to claim 1, wherein said first reflective layer is formed on the second surface of said substrate, and said first electrode is formed on the second surface of said substrate surrounding said first reflective layer.

4. The light-emitting device according to claim 1, wherein said first electrode is formed of a transparent electrode between the second surface of said substrate and said first reflective layer.

5. The light-emitting device according to claim 1, further comprising a control layer on the first surface of said substrate to act as a mask in forming said doped region and to limit the depth of said doped region to be ultra-shallow.

6. The light-emitting device according to claim 1, further comprising a control layer on the first surface of said substrate to act as a mask in forming said doped region and to limit the depth of said doped region to be ultra-shallow.

7. The light-emitting device according to claim 5, wherein said substrate is formed of a predetermined semiconductor material including silicon, and said control layer is formed of a silicon oxide layer of an appropriate thickness such that said doped region is formed to the ultra-shallow depth.

8. The light-emitting device according to claim 6, wherein said substrate is formed of a predetermined semiconductor material including silicon, and said control layer is formed of a silicon oxide layer of an appropriate thickness such that said doped region can be formed to the ultra-shallow depth.

9. A light-emitting apparatus applicable to an illumination system or a display system, the light-emitting apparatus comprising:
   at least one light-emitting device comprising:
      an n-type or p-type substrate;
      a doped region formed on a first surface of said substrate with a predetermined dopant to be an opposite type from that of said substrate, and to have an ultra-shallow so such that light is emitted from a p-n junction between said doped region and said substrate by a quantum confinement effect;
      a resonator which improves the selectivity of wavelength of the light emitted from the p-n junction; and
      first and second electrodes formed on the first surface and a second surface of said substrate, respectively, for injection of holes and electrons,
   wherein the resonator includes:
      a first reflective layer formed on the second surface of said substrate; and
      a second reflective layer formed on said doped region and together with said first reflective layer improves the selectivity of the wavelength of light being emitted,
      one of said first and second reflective layers being formed with a lower reflectivity than the other so that the light externally emits through said first or second reflective layer having the lower reflectivity.

10. The light-emitting apparatus according to claim 9, wherein said second reflective layer is a distributed Bragg reflector (DBR) formed by alternating material layers having different refractive indices.

11. The light-emitting apparatus according to claim 9, wherein said first reflective layer is formed on the second surface of said substrate, and the first electrode is formed on the second surface of said substrate surrounding said first reflective layer.

12. The light-emitting apparatus according to claim 9, wherein said first electrode is formed of a transparent electrode between the second surface of said substrate and said first reflective layer.

13. The light-emitting apparatus according to claim 9, wherein the light-emitting device further comprises:
   a control layer on the first surface of said substrate to act as a mask in forming said doped region and to limit the depth of the doped region to be ultra-shallow.

14. The light-emitting apparatus according to claim 13, wherein said substrate is formed of a predetermined semiconductor material including silicon, and said control layer is formed of a silicon oxide layer of an appropriate thickness such that said doped region is formed to the ultra-shallow depth.

15. The light-emitting device according to claim 1, wherein said doped region is doped to the ultra-shallow depth by a non-equillibrium diffusion of boron.

16. The light-emitting device according to claim 1, wherein said doped region is doped to the ultra-shallow depth by a non-equillibrium diffusion of phosphorus.

17. The light-emitting device according to claim 1, wherein said doped region is doped to the ultra-shallow depth so that one of a quantum well, quantum dot, and a quantum wire is formed between said doped region and said substrate to provide a the quantum confinement effect to enable photoelectric conversion.

18. The light-emitting device according to claim 1, wherein said first reflective layer is a distributed Bragg reflector (DBR).

19. The light-emitting device according to claim 4, wherein said first electrode is formed of indium tin oxide (ITO).

20. The light-emitting device according to claim 18, wherein said second reflective layer is a distributed Bragg reflector (DBR).

21. The light emitting device according to claim 20, wherein said DBR is formed by alternating material layers having different reflective indices.

22. The light-emitting device according to claim 21, wherein said second reflective layer is formed by stacking less material layers than said first reflective layer so that said second reflective layer has a lower reflectivity than said first reflective layer.

* * * * *